US010781530B2

(12) United States Patent
Yamakawa

(10) Patent No.: US 10,781,530 B2
(45) Date of Patent: Sep. 22, 2020

(54) CLEANING APPARATUS, PLATING APPARATUS USING THE SAME, AND CLEANING METHOD

(71) Applicant: EBARA CORPORATION, Tokyo (JP)

(72) Inventor: Junitsu Yamakawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 123 days.

(21) Appl. No.: 15/636,041

(22) Filed: Jun. 28, 2017

(65) Prior Publication Data

US 2017/0370016 A1 Dec. 28, 2017

(30) Foreign Application Priority Data

Jun. 28, 2016 (JP) ................... 2016-127630
Jun. 28, 2016 (JP) ................... 2016-133933

(51) Int. Cl.
| | |
|---|---|
| *C25D 17/00* | (2006.01) |
| *H01L 21/02* | (2006.01) |
| *B08B 5/02* | (2006.01) |
| *B08B 3/04* | (2006.01) |
| *C25D 21/08* | (2006.01) |
| *B08B 3/02* | (2006.01) |

(Continued)

(52) U.S. Cl.
CPC ........... *C25D 17/001* (2013.01); *B08B 3/022* (2013.01); *B08B 3/04* (2013.01); *B08B 5/023* (2013.01); *C25D 21/08* (2013.01); *H01L 21/02068* (2013.01); *H01L 21/2885* (2013.01); *H05K 3/0085* (2013.01); *H05K 3/26* (2013.01); *H05K 2203/075* (2013.01)

(58) Field of Classification Search
CPC .......... B08B 3/022; B08B 3/04; B08B 5/023; C25D 17/001; C25D 21/08; H01L 21/02068; H01L 21/2885; H05K 2203/075; H05K 3/0085; H05K 3/26
See application file for complete search history.

(56) References Cited

U.S. PATENT DOCUMENTS 6,203,582 B1 * 3/2001 Berner ............. H01L 21/67173
29/25.01
6,354,481 B1 * 3/2002 Rich ..................... B23K 1/008
228/19

(Continued)

FOREIGN PATENT DOCUMENTS

| CN | 202962971 U | 6/2013 |
| JP | S61-33685 U | 2/1986 |

(Continued)

*Primary Examiner* — Benjamin L Osterhout
(74) *Attorney, Agent, or Firm* — BakerHostetler

(57) ABSTRACT

A cleaning apparatus is provided. This cleaning apparatus includes an inlet, an outlet, a first conveyance path, a second conveyance path, a cleaning unit disposed on the first conveyance path and configured to clean the target object in a non-contacting manner, and a drying unit disposed on the first conveyance path and configured to dry the target object in a non-contacting manner. The first conveyance path and the second conveyance path are vertically arranged side by side. The second conveyance path is positioned above the first conveyance path and connected with the outlet at an end point. The second conveyance path functions as a stocker configured to temporarily store the target object.

20 Claims, 3 Drawing Sheets

(51) Int. Cl.
*H01L 21/288* (2006.01)
*H05K 3/26* (2006.01)
*H05K 3/00* (2006.01)

(56) References Cited

U.S. PATENT DOCUMENTS

| | | | |
|---|---|---|---|
| 6,446,855 B1 * | 9/2002 | Rich | B23K 1/206 228/19 |
| 2002/0014469 A1 | 2/2002 | Uratsuji et al. | |
| 2003/0113189 A1 * | 6/2003 | Kaji | G05B 19/042 414/217 |
| 2008/0085658 A1 | 4/2008 | Katsuoka et al. | |
| 2010/0123368 A1 * | 5/2010 | Fujii | B41J 2/14233 310/334 |
| 2010/0324717 A1 * | 12/2010 | Akiyama | B65G 49/062 700/112 |
| 2011/0308626 A1 * | 12/2011 | Ogata | H01L 21/67028 137/2 |

FOREIGN PATENT DOCUMENTS

| | | |
|---|---|---|
| JP | 2000-183019 A | 6/2000 |
| JP | 2001-009392 A | 1/2001 |
| JP | 2001-345544 A | 12/2001 |
| JP | 2004-140336 A | 5/2004 |
| JP | 2008-110471 A | 5/2008 |
| JP | 2008-159663 A | 7/2008 |
| JP | 2010-064196 A | 3/2010 |
| JP | 2010-118644 A | 5/2010 |
| JP | 2013-149942 A | 8/2013 |
| JP | 2014-083489 A | 5/2014 |
| KR | 2009-0035106 A | 4/2009 |
| KR | 2010-0062402 A | 6/2010 |
| KR | 2014-0029661 A | 3/2014 |

* cited by examiner

CLEANING APPARATUS, PLATING APPARATUS USING THE SAME, AND CLEANING METHOD

CROSS-REFERENCE TO RELATED APPLICATION

This application is based upon and claims benefit of priority from Japanese Patent Application No. 2016-127630 filed on Jun. 28, 2016 and Japanese Patent Application No. 2016-133933 filed on Jul. 6, 2016, the entire contents of which are incorporated herein by reference.

BACKGROUND OF THE INVENTION

Field of the Invention

The present invention relates to a cleaning apparatus, a plating apparatus using the same, and a cleaning method.

Description of the Related Art

It has been a conventional practice to form wires and bumps (protruded electrodes) on the surface of a substrate such as a semiconductor wafer or a printed board. This formation of wires, bumps, and the like has been performed by a known method called an electrolytic plating.

A plating apparatus used in the electrolytic plating performs plating processing on a circular substrate such as a wafer typically having a diameter of 300 mm. In addition to such a circular substrate, however, a rectangular substrate has been required to be plated recently. In conventional plating of a circular substrate through a plating apparatus, the plated circular substrate has been cleaned and dried at a spin rinse dryer (SRD). The SRD cleans and dries a substrate while rotating the substrate.

The size or stiffness of a rectangular substrate differs between the kinds of product. A typical SRD is configured to clean a substrate having a predetermined size, and thus potentially unable to clean and dry a large rectangular substrate. When having a small stiffness, a rectangular substrate potentially becomes curved, which makes it difficult to clean and dry the substrate appropriately through the SRD. Similarly, the SRD is unable to clean and dry a large circular substrate in some cases.

Examples of a conventionally known device configured to clean and dry a rectangular substrate or the like include a cleaning apparatus (refer to Japanese Patent Laid-Open No. 2010-64196, for example) configured to clean a substrate by placing a roll sponge on the surface of the substrate, and a cleaning apparatus (refer to Japanese Patent Laid-Open No. 2008-110471, for example) configured to spray cleaning liquid onto the surface of a substrate and absorb the cleaning liquid with a sponge roll.

Wires and resist patterns are formed on the surface of a plated rectangular substrate. Thus, when the substrate is cleaned by the cleaning apparatuses disclosed in Japanese Patent Laid-Open No. 2010-64196 and Japanese Patent Laid-Open No. 2008-110471 while a sponge is directly in contact with the surface of the substrate, the resist pattern potentially flakes into particles and adheres to the rectangular substrate, or the wiring pattern potentially breaks. Similarly, the cleaning apparatuses disclosed in Japanese Patent Laid-Open No. 2010-64196 and Japanese Patent Laid-Open No. 2008-110471 can cause the same problem on a circular substrate.

The present invention is intended to solve the above-described problem. An object of the present invention is to clean a substrate with reduced influence on a resist pattern, a wire, or the like on the surface of the substrate.

SUMMARY OF THE INVENTION

A cleaning apparatus is provided as an embodiment of the present invention. This cleaning apparatus includes an inlet for a target object, an outlet for the target object, a first conveyance path on which the target object input through the inlet is conveyed, a second conveyance path on which the target object is conveyed in a direction opposite to a direction of conveyance of the target object on the first conveyance path and that is connected with the first conveyance path and the outlet, a cleaning unit disposed on the first conveyance path and configured to clean the target object in a non-contacting manner, and a drying unit disposed on the first conveyance path and configured to dry the target object in a non-contacting manner. The first conveyance path and the second conveyance path are vertically arranged side by side. The second conveyance path is positioned above the first conveyance path and connected with the outlet at an end point. The second conveyance path functions as a stocker configured to temporarily store the target object.

A cleaning apparatus is provided as another embodiment of the present invention. This cleaning apparatus includes an inlet for a target object, an outlet for the target object, a first conveyance path on which the target object input through the inlet is conveyed, a second conveyance path on which the target object is conveyed in a direction opposite to a direction of conveyance of the target object on the first conveyance path and that is connected with the first conveyance path and the outlet, a cleaning unit disposed on the first conveyance path and configured to clean the target object in a non-contacting manner, and a drying unit disposed on the first conveyance path and configured to dry the target object in a non-contacting manner. The cleaning apparatus further includes an outlet shutter configured to open and close the outlet, and a blowing unit disposed at an end point of the second conveyance path and configured to send gas downward from above. The second conveyance path functions as a stocker configured to temporarily store the target object.

A cleaning apparatus is provided as another embodiment of the present invention. This cleaning apparatus includes an inlet for a target object, an outlet for the target object, a first conveyance path on which the target object input through the inlet is conveyed, a second conveyance path on which the target object is conveyed in a direction opposite to a direction of conveyance of the target object on the first conveyance path and that is connected with the first conveyance path and the outlet, a cleaning unit disposed on the first conveyance path and configured to clean the target object in a non-contacting manner, and a drying unit disposed on the first conveyance path and configured to dry the target object in a non-contacting manner. The first conveyance path and the second conveyance path are vertically arranged side by side, and the second conveyance path is positioned above the first conveyance path and connected with the outlet at an end point. The cleaning apparatus further includes an outlet shutter configured to open and close the outlet, and a blowing unit disposed at the end point of the second conveyance path and configured to send gas downward from above.

A method is provided as another embodiment of the present invention. The method cleans a target object in a cleaning apparatus including an inlet for the target object, an outlet for the target object, a first conveyance path on which the target object input through the inlet is conveyed, a second conveyance path on which the target object is conveyed in a direction opposite to a direction of conveyance of the target object on the first conveyance path and that is connected with the first conveyance path and the outlet, and an outlet shutter configured to open and close the outlet. This cleaning method includes a process of inputting the target object into the cleaning apparatus through the inlet, a process of conveying the target object along the first conveyance path, a cleaning process of cleaning the target object in a non-contacting manner on the first conveyance path, a drying process of drying the target object in a non-contacting manner on the first conveyance path, a process of conveying the target object along the second conveyance path, and a process of taking the target object out of the outlet. The first conveyance path and the second conveyance path are vertically arranged side by side. The first conveyance path is positioned below the second conveyance path and connected with the outlet at an end point. The cleaning method further includes a blowing process of sending gas downward from above at the end point of the second conveyance path.

DETAILED DESCRIPTION OF THE PREFERRED EMBODIMENTS

Figure 1:
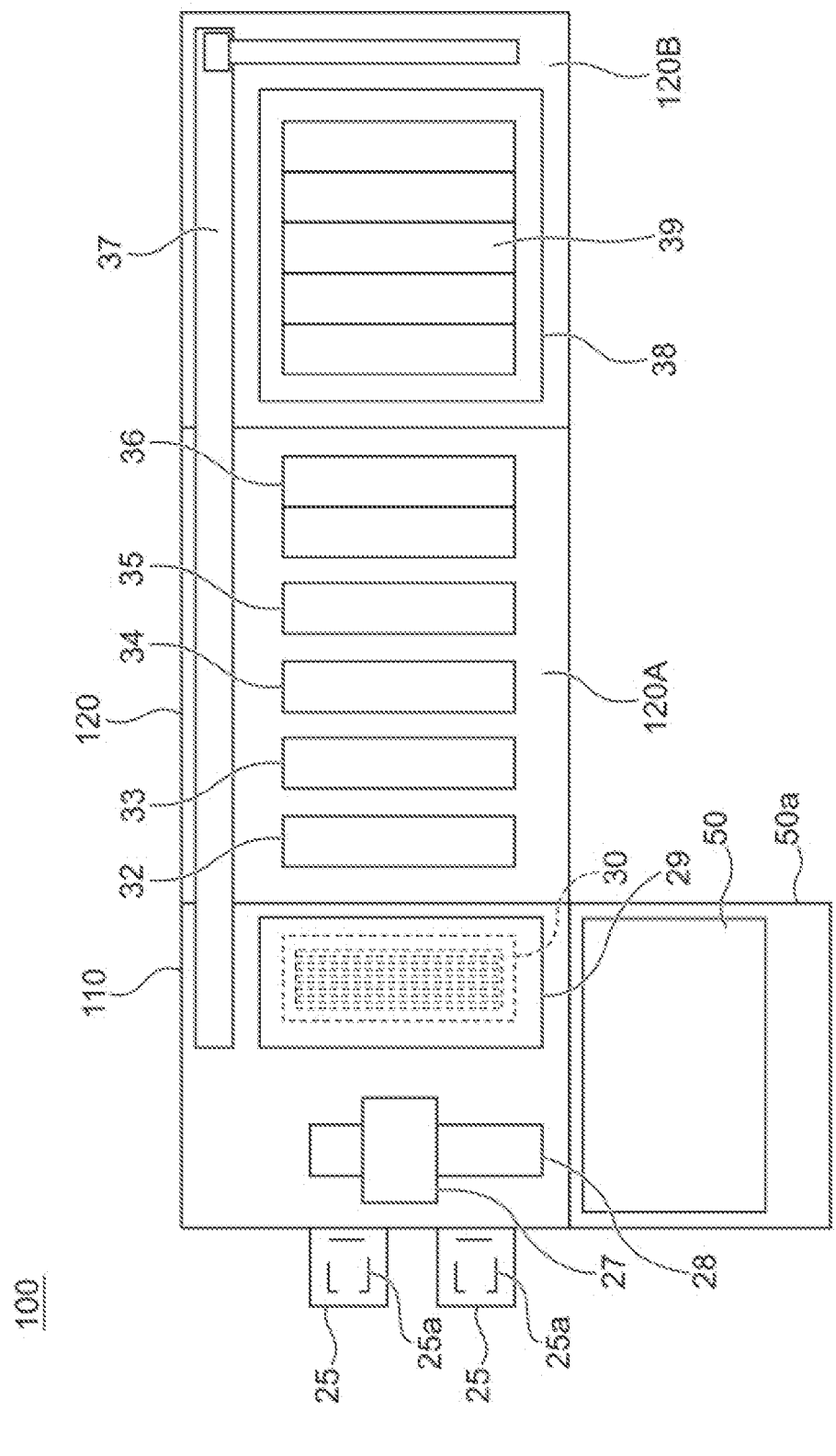
FIG. 1 is an entire layout diagram of a plating apparatus including a cleaning apparatus according to the present embodiment.

The following describes embodiments of the present invention with reference to the accompanying drawings. In the drawings to be described below, any identical or equivalent components are denoted by an identical reference sign, and duplicate description thereof will be omitted. FIG. 1 is an entire layout diagram of a plating apparatus including a cleaning apparatus according to the present embodiment. As illustrated in FIG. 1, this plating apparatus 100 mainly includes a loading/unloading unit 110 configured to load a substrate (corresponding to an exemplary target object) onto a substrate holder and unload the substrate from the substrate holder, a processing unit 120 configured to process the substrate, and a cleaning part 50a. The processing unit 120 includes a preprocessing-postprocessing unit 120A configured to perform preprocessing and postprocessing on the substrate, and a plating processing unit 120B configured to perform plating processing on the substrate. Substrates processed through the plating apparatus 100 include rectangular and circular substrates. The rectangular substrates include rectangular printed boards and any other rectangular plating objects.

The loading/unloading unit 110 includes two cassette tables 25 and a substrate attaching mechanism 29. A cassette 25a housing a substrate such as a semiconductor wafer or a printed board is mounted on each cassette table 25. The substrate attaching mechanism 29 is configured to attach and detach the substrate to and from a substrate holder (not illustrated). A stocker 30 for housing the substrate holder is provided near (for example, below) the substrate attaching mechanism 29. A substrate conveying device 27 including a conveyance robot configured to convey the substrate between these components 25, 29, and 30 is disposed in the center of the components. The substrate conveying device 27 is configured to be movable by a movement mechanism 28.

The cleaning part 50a includes a cleaning apparatus 50 configured to clean and dry a substrate that has been subjected to plating processing. The substrate conveying device 27 is configured to convey the substrate that has been subjected to plating processing into the cleaning apparatus 50 and take the cleaned substrate out of the cleaning apparatus 50. The cleaning apparatus 50 will be described in detail with reference to FIG. 2 later.

The preprocessing-postprocessing unit 120A includes a pre-wet bath 32, a pre-soak bath 33, a pre-rinse bath 34, a blow bath 35, and a rinse bath 36. In the pre-wet bath 32, a substrate is immersed into pure water. In the pre-soak bath 33, an oxide film on the surface of a conductive layer such as a seed layer formed on the surface of the substrate is removed by etching. In the pre-rinse bath 34, the pre-soaked substrate is cleaned by cleaning liquid (for example, pure water) together with a substrate holder. In the blow bath 35, liquid on the cleaned substrate is removed. In the rinse bath 36, the substrate that has been subjected to plating is cleaned by cleaning liquid together with the substrate holder. The pre-wet bath 32, the pre-soak bath 33, the pre-rinse bath 34, the blow bath 35, and the rinse bath 36 are disposed in this order.

The plating processing unit 120B includes a plurality of plating baths 39 provided with an overflow bath 38. Each plating bath 39 houses one substrate and performs plating such as copper plating on the surface of the substrate being immersed in plating solution stored therein. The plating solution is not limited to a particular kind, but various kinds of plating solution may be applicable depending on usage.

The plating apparatus 100 includes a substrate-holder conveying device 37 disposed beside these instruments and employing, for example, a linear motor scheme to convey the substrate holder together with the substrate between these instruments. The substrate-holder conveying device 37 is configured to convey the substrate holder between the substrate attaching mechanism 29, the pre-wet bath 32, the pre-soak bath 33, the pre-rinse bath 34, the blow bath 35, the rinse bath 36, and the plating baths 39.

Figure 2:
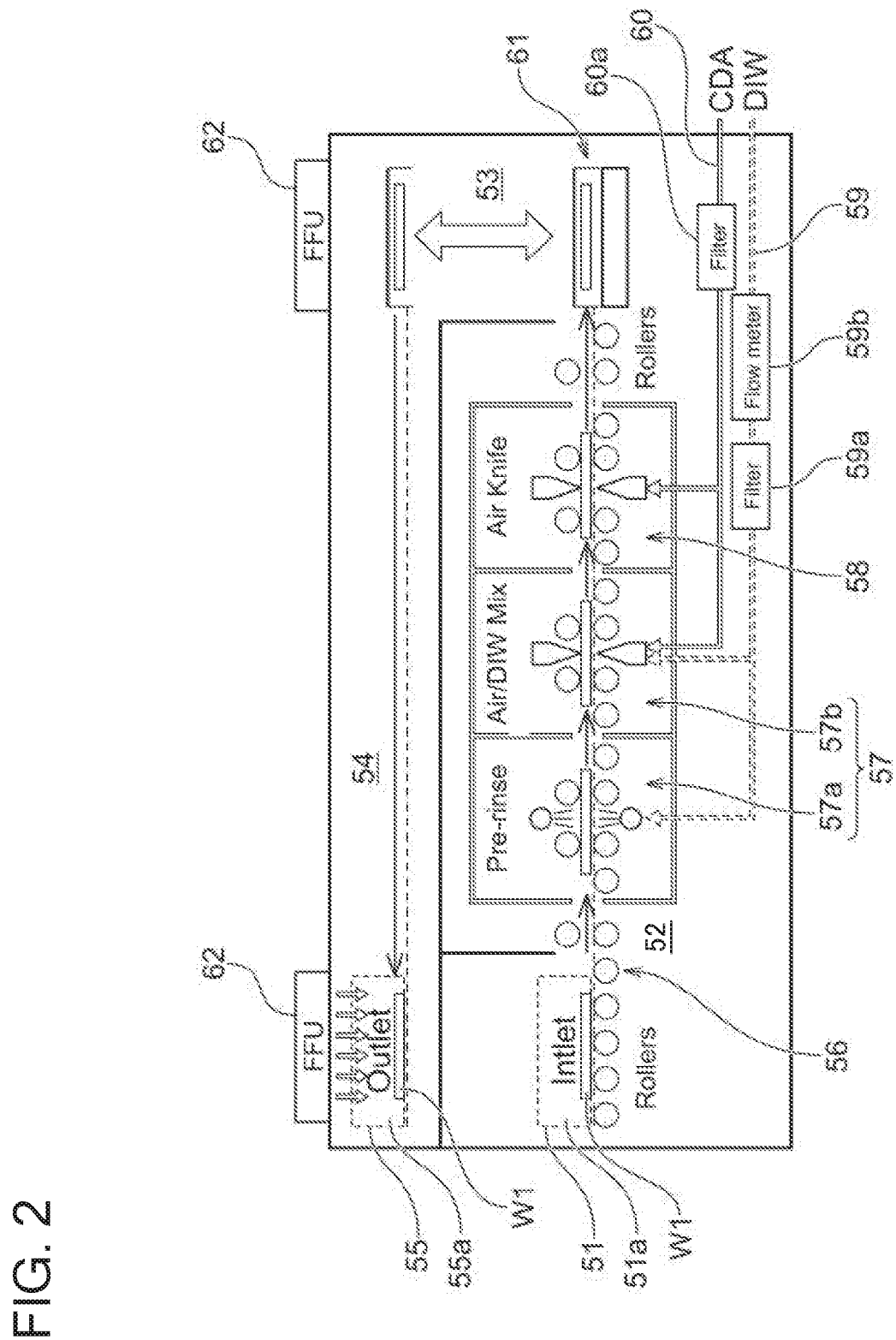
FIG. 2 is a schematic sectional side view of the cleaning apparatus.

The following describes the cleaning apparatus 50 illustrated in FIG. 1 in detail. FIG. 2 is a schematic sectional side view of the cleaning apparatus 50. The cleaning apparatus 50 includes an inlet 51 for a substrate W1, a first conveyance path 52, a vertical conveyance path 53, a second conveyance path 54, and an outlet 55 for the substrate W1. As illustrated in FIG. 2, the first conveyance path 52 and the second conveyance path 54 are vertically arranged side by side, and the first conveyance path 52 is positioned below the second conveyance path 54. The first conveyance path 52 is a path that is communicated with the inlet 51 and on which the substrate W1 input through the inlet 51 is conveyed. The second conveyance path 54 is a path on which the substrate W1 is conveyed in a direction opposite to a direction in which the substrate W1 is conveyed on the first conveyance path 52. The second conveyance path 54 is connected with the first conveyance path 52 through the vertical conveyance path 53 and communicated with the outlet 55. The vertical conveyance path 53 is a path extending in the vertical direction to connect the first conveyance path 52 and the second conveyance path 54.

The inlet 51 is provided with an inlet shutter 51a for opening and closing the inlet 51. The outlet 55 is provided with an outlet shutter 55a for opening and closing the outlet 55. When the cleaning apparatus 50 is mounted on the plating apparatus 100 as in the present embodiment, or is mounted on, for example, a CMP apparatus, particles generated by cleaning float in the cleaning apparatus 50, and thus atmosphere in the cleaning apparatus 50 has been degraded in terms of cleanness as compared to that in the plating apparatus 100 or, for example, the CMP apparatus. When negative pressure is maintained inside the cleaning apparatus 50, reduction can be achieved in flow of particles from the inside of the cleaning apparatus 50 to the outside thereof. However, negative pressure cannot be maintained inside the cleaning apparatus 50, for example, when a pressure adjusting device is failed. In the present embodiment, since the inside and outside of the cleaning apparatus 50 can be separated by the inlet shutter 51a and the outlet shutter 55a, further reduction can be achieved in the external flow of particles from the inside of the cleaning apparatus 50.

As illustrated in FIG. 2, the first conveyance path 52 is provided with a horizontal conveyance mechanism 56 including, for example, a plurality of rollers that convey the substrate W1 to the vertical conveyance path 53. The rollers of the horizontal conveyance mechanism 56 may be disposed to only contact a predetermined place of the substrate W1 depending on, for example, the strength and material of the substrate W1. For example, the rollers of the horizontal conveyance mechanism 56 may be disposed to only contact a central part and both edge parts of the substrate W1 in the width direction. An alignment mechanism configured to adjust the position of the substrate W1 input through the inlet 51 may be provided near the inlet 51 of the first conveyance path 52. With this configuration, the substrate W1 input through the inlet 51 can be placed at an appropriate position on the horizontal conveyance mechanism 56.

The first conveyance path 52 is provided with a cleaning unit 57 configured to clean the substrate W1 and a drying unit 58 configured to dry the substrate W1. In an embodiment, the cleaning unit 57 includes a first cleaning unit 57a and a second cleaning unit 57b positioned downstream of the first cleaning unit 57a. The first cleaning unit 57a cleans the substrate W1 by spraying de-ionized water (DIW; corresponding to exemplary cleaning liquid) onto both or one of the surfaces of the substrate W1. The second cleaning unit 57b removes particles on the surface of the substrate W1 by jet-spraying DIW and gas simultaneously onto both or one of the surfaces of the substrate W1. The gas sprayed by the second cleaning unit 57b may be clean dry air or nitrogen. The first cleaning unit 57a and the second cleaning unit 57b are each what is called a non-contacting cleaning unit configured to clean the substrate W1 with liquid or gas. The drying unit 58 is, for example, what is called an air knife configured to spray compressed gas in a thin layer shape out of an elongated slit to remove or dry cleaning liquid adhering to both or one of the surfaces of the substrate W1. The drying unit 58 is what is called a non-contacting drying unit configured to dry the substrate W1 with gas.

The first cleaning unit 57a, the second cleaning unit 57b, and the drying unit 58 are each enclosed by an independent chamber. Atmosphere in any opening communicating the chambers is separated by, for example, an air curtain (not illustrated). The first cleaning unit 57a and the second cleaning unit 57b are connected with a DIW supply line 59 for supplying DIW to these units. The second cleaning unit 57b and the drying unit 58 are connected with a gas supply line 60 for supplying gas to these units. The DIW supply line 59 is provided with a filter 59a for capturing particles in DIW and a flow meter 59b configured to measure the flow rate of DIW. The gas supply line 60 is provided with a filter 60a for capturing particles in gas.

The vertical conveyance path 53 is provided with a vertical conveyance mechanism 61 configured to receive the substrate W1 conveyed by the horizontal conveyance mechanism 56 and convey the substrate W1 in the vertical direction from the first conveyance path 52 to the second conveyance path 54. The vertical conveyance mechanism 61 includes, for example, a supporting table that supports the substrate W1, and an elevation mechanism configured to elevate up and down the supporting table. The vertical conveyance mechanism 61 may include a substrate conveying mechanism such as a roller for passing the substrate W1 from the supporting table to a horizontal conveyance mechanism (not illustrated) provided to the second conveyance path 54. When the first conveyance path 52 and the second conveyance path 54 are vertically arranged side by side as in the present embodiment, the substrate W1 can be conveyed from the first conveyance path 52 to the second conveyance path 54 by the vertical conveyance mechanism 61.

The second conveyance path 54 is provided with a horizontal conveyance mechanism (not illustrated) for horizontally conveying, to the outlet 55, the substrate W1 conveyed by the vertical conveyance mechanism 61. This horizontal conveyance mechanism may be, for example, a roller similarly to the horizontal conveyance mechanism 56, or a well-known robot hand. The second conveyance path 54 is provided with a blowing unit 62 such as a fun filter unit (FFU) configured to send gas downward from above. In the example illustrated in FIG. 2, the blowing unit 62 is provided near each of start and end points of the second conveyance path 54. Examples of the gas sent by the blowing unit 62 include clean dry air and nitrogen. An alignment mechanism configured to adjust the position of the substrate W1 taken out of the outlet 55 may be provided near the outlet 55 of the second conveyance path 54. With this configuration, the substrate W1 can be placed at an appropriate position on the horizontal conveyance mechanism 56 to allow the substrate conveying device 27 illustrated in FIG. 1 to take the substrate W1 out of the outlet 55 by more reliably holding the substrate W1.

The following describes a process of cleaning the substrate W1 by using the cleaning apparatus 50 described above. First, the substrate conveying apparatus 27 holds the substrate W1 plated in the plating apparatus 100 illustrated in FIG. 1. By this time, the liquid removal has been performed on the substrate W1 at the blow bath 35 illustrated in FIG. 1, but the surface of the substrate W1 is slightly wet. When the inlet shutter 51a of the cleaning apparatus 50 is opened, the substrate conveying device 27 inputs the substrate W1 into the cleaning apparatus 50 through the inlet 51. When the substrate W1 is input to the cleaning apparatus 50, the inlet shutter 51a is closed. The horizontal conveyance mechanism 56 of the cleaning apparatus 50 conveys the substrate W1 input through the inlet 51 along the first conveyance path 52. While being conveyed through the first conveyance path 52, the substrate W1 is cleaned by the first cleaning unit 57a and the second cleaning unit 57b in a non-contacting manner. Specifically, the substrate W1 is cleaned first by the first cleaning unit 57a spraying DIW onto the surface of the substrate W1, and subsequently by the second cleaning unit 57b spraying cleaning liquid and gas simultaneously onto the surface of the substrate W1. Thereafter, at the drying unit 58, the cleaning liquid on the substrate W1 is removed by the air knife and then the substrate W1 is dried.

Having passed through the first conveyance path 52, the substrate W1 is received by the vertical conveyance mechanism 61. The vertical conveyance mechanism 61 conveys the substrate W1 in the vertical direction from the first conveyance path 52 to the second conveyance path 54. Having been conveyed onto the second conveyance path 54, the substrate W1 is conveyed along the second conveyance path 54 by the horizontal conveyance mechanism (not illustrated). The blowing unit 62 sends gas downward from above on the second conveyance path 54. The gas presses particles inside the cleaning apparatus 50 downward to maintain clean atmosphere in the second conveyance path 54.

When the substrate W1 is conveyed near the outlet 55, the outlet shutter 55a is opened so that the substrate W1 is taken out of the cleaning apparatus 50 through the outlet 55 by the substrate conveying device 27 illustrated in FIG. 1. The substrate conveying device 27 houses the substrate W1 taken out of the cleaning apparatus 50 into the cassette 25a inside the cassette tables 25 illustrated in FIG. 1.

The cleaning apparatus 50 may temporarily store the substrate W1 conveyed on the second conveyance path 54, on the second conveyance path 54 before taking the substrate W1 out of the cleaning apparatus 50. In other words, the second conveyance path 54 functions as a stocker configured to temporarily store the substrate W1. Specifically, for example, the horizontal conveyance mechanism (not illustrated) on the second conveyance path 54 may stop conveying the substrate W1 to temporarily store the substrate W1 on the second conveyance path 54. Since the second conveyance path 54 is positioned above the first conveyance path 52 and particles are pressed downward (closer to the first conveyance path 52) by the blowing unit 62, the second conveyance path 54 contains atmosphere cleaner than that in the first conveyance path 52. Accordingly, the substrate W1 can be temporarily stored in relatively normal atmosphere, and thus can be taken out of the cleaning apparatus 50 at an optional appropriate timing when the substrate W1 is plated with priority on the throughput of the plating apparatus 100 illustrated in FIG. 1.

As described above, in the cleaning apparatus according to the present embodiment, the substrate W1 is cleaned in a non-contacting manner and dried in a non-contacting manner, which leads to reduced influence on resist patterns, wires, and the like on the surface of the substrate W1. The "non-contacting manner" refers to a scheme in which no solid object such as a sponge roll contacts the substrate W1. Since the substrate W1 is conveyed in opposite directions on the first conveyance path 52 and the second conveyance path 54, a round-trip path is formed by the first conveyance path 52 and the second conveyance path 54, which provides a sufficient path length while achieving reduction in the entire length of the cleaning apparatus 50. The round-trip path formed by the first conveyance path 52 and the second conveyance path 54 allows close arrangement of the inlet 51 and the outlet 55. With this configuration, the substrate W1 can be input to the inlet 51 and taken out of the outlet 55 without involving large movement of the single substrate conveying device 27.

According to the present embodiment, the substrate W1 is cleaned and dried on the first conveyance path 52 connected with the inlet 51, and thereafter conveyed to the outlet 55 through the second conveyance path 54. If the cleaning unit 57 and the drying unit 58 are provided on the second conveyance path 54 connected with the outlet 55, not on the first conveyance path 52 connected with the inlet 51, to clean and dry the substrate W1, the substrate W1 is cleaned and dried on the second conveyance path 54 after having passed through the first conveyance path 52. Thus, time is needed before the substrate W1 is cleaned and dried on the second conveyance path 54. In this case, processing liquid such as plating solution adhering to the surface of the substrate W1 is naturally dried before the substrate W1 is cleaned and dried, so that particles included in the processing liquid adhere to the surface of the substrate W1 and become hard to remove. According to the present embodiment, however, the substrate W1 input through the inlet 51 can be immediately cleaned and dried on the first conveyance path 52 before the processing liquid on the surface of the substrate W1 is naturally dried. This can prevent the adhesion of particles to the surface of the substrate W1, which would otherwise cause difficulties in removal.

According to the present embodiment, since the first conveyance path 52 and the second conveyance path 54 are vertically arranged side by side, the footprint of the cleaning apparatus 50 required for disposition of the first conveyance path 52 and the second conveyance path 54 can be reduced. Since the first conveyance path 52 is positioned below the second conveyance path 54, the substrate W1 can be conveyed through the second conveyance path 54 containing atmosphere cleaner than that in the first conveyance path 52 while particles generated by cleaning are accumulated in the first conveyance path 52 positioned lower. This configuration can further achieve reduction of contact of the cleaned and dried substrate W1 with particles in air. However, the present invention is not limited thereto, and the first conveyance path 52 provided with the cleaning unit 57 and the drying unit 58 may be positioned above the second conveyance path 54. Alternatively, the first conveyance path 52 and the second conveyance path 54 may be arranged in parallel in the lateral direction when no severe restriction is placed on the installation area of the cleaning apparatus 50. In this case, a horizontal conveyance path connecting the first conveyance path 52 and the second conveyance path 54 is provided in place of the vertical conveyance path 53 so that the entire path substantially has a U shape in plan view.

In the present embodiment, the cleaning unit 57 includes the first cleaning unit 57a and the second cleaning unit 57b, but the present invention is not limited thereto. The cleaning unit 57 may include only one of the first cleaning unit 57a and the second cleaning unit 57b. For example, the first cleaning unit 57a may be omitted because less particles adhere to the substrate W1 plated by the plating apparatus 100 as in the present embodiment than to a substrate processed by a substrate polishing apparatus. Although the cleaning apparatus 50 according to the present embodiment is provided to the plating apparatus 100, the present invention is not limited thereto. Instead, the cleaning apparatus 50 may be provided to another substrate processing apparatus such as a substrate polishing apparatus. Thus, examples of a target object cleaned by the cleaning apparatus 50 include any optional object other than a circular substrate and a rectangular substrate. Although the plating apparatus 100 plates the substrate W1 by using the substrate holder in the present embodiment, the cleaning apparatus 50 according to the present embodiment may be provided to a plating apparatus configured to plate a substrate without using a substrate holder.

Figure 3:
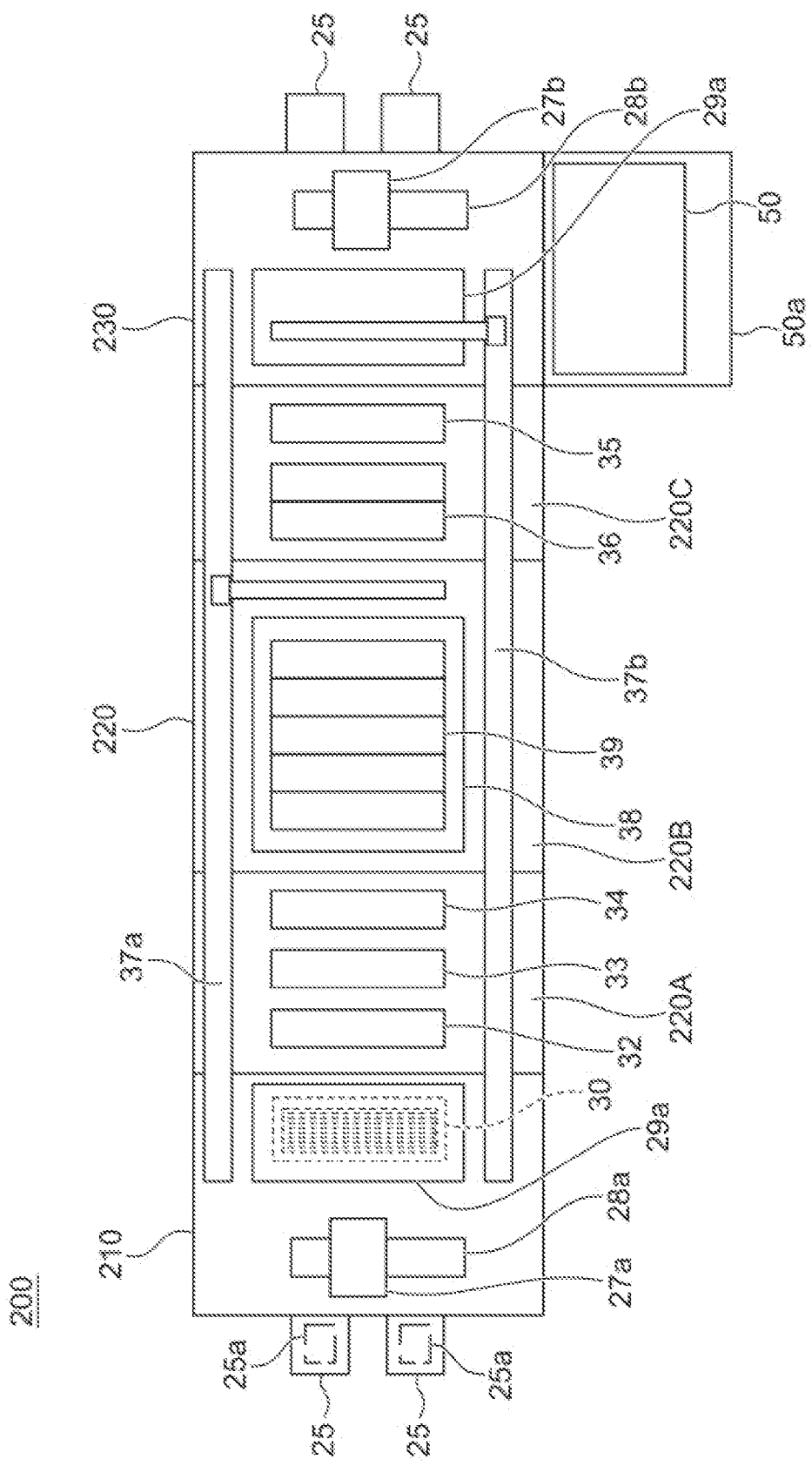
FIG. 3 is an entire layout diagram of another plating apparatus including the cleaning apparatus according to the present embodiment.

The following describes another exemplary plating apparatus including the cleaning apparatus according to the present embodiment. FIG. 3 is an entire layout diagram of another plating apparatus including the cleaning apparatus according to the present embodiment. As illustrated in FIG. 3, this plating apparatus 200 mainly includes a loading/unloading unit 210 configured to load a substrate onto a substrate holder, a processing unit 220 configured to process the substrate, an unloading/unloading unit 230 configured to unload the substrate from the substrate holder, and the cleaning part 50a. The processing unit 220 includes a preprocessing unit 220A configured to perform preprocessing on the substrate, a plating processing unit 220B configured to perform plating processing on the substrate, and a postprocessing unit 220C configured to perform postprocessing on the substrate. Similarly to the plating apparatus 100 illustrated in FIG. 1, examples of the substrate processed by the plating apparatus 200 include rectangular and circular substrates. The rectangular substrates include a rectangular printed board and any other plating object.

The loading/unloading unit 210 includes the two cassette tables 25, a substrate attaching mechanism 29a, the stocker 30, a substrate conveying device 27a, and a movement mechanism 28a for the substrate conveying device 27a. The substrate attaching mechanism 29a of the loading/unloading unit 210 holds the substrate with the substrate holder (not illustrated).

The preprocessing unit 220A is disposed downstream of the loading/unloading unit 210. The preprocessing unit 220A includes the pre-wet bath 32, the pre-soak bath 33, and the pre-rinse bath 34. The pre-wet bath 32, the pre-soak bath 33, and the pre-rinse bath 34 are disposed in this order.

The plating processing unit 220B is disposed downstream of the preprocessing unit 220A. The plating processing unit 220B includes the plating baths 39 provided with the overflow bath 38. The postprocessing unit 220C is disposed downstream of the plating processing unit 220B. The postprocessing unit 220C includes the rinse bath 36 and the blow bath 35. The rinse bath 36 and the blow bath 35 are disposed in this order toward downstream.

The unloading/unloading unit 230 is disposed downstream of the postprocessing unit 220C. The unloading/unloading unit 230 includes the two cassette tables 25, a substrate attaching mechanism 29b, a substrate conveying device 27b, and a movement mechanism 28b for the substrate conveying device 27b. The cleaning part 50a includes the cleaning apparatus 50 illustrated in FIG. 2. The substrate conveying device 27b is configured to convey a substrate that has been subjected to plating processing into the cleaning apparatus 50 and then take the substrate out of the cleaning apparatus 50.

The plating apparatus 200 includes substrate-holder conveying devices 37a and 37b positioned beside these instruments and configured to convey a substrate holder together with a substrate between these instruments. The substrate-holder conveying devices 37a and 37b are configured to convey the substrate holder between the substrate attaching mechanisms 29a and 29b, the pre-wet bath 32, the pre-soak bath 33, the pre-rinse bath 34, the blow bath 35, the rinse bath 36, and the plating baths 39. When the two substrate-holder conveying devices 37a and 37b are provided as illustrated in FIG. 3, one of the substrate-holder conveying devices conveys only a substrate holder holding a substrate yet to be subjected to plating processing, and the other substrate-holder conveying device conveys only a substrate holder holding a substrate that has been subjected to plating processing. This configuration prevents occurrence of a wait time taken for handover of a substrate holder. Only one of the substrate-holder conveying devices 37a and 37b may be provided to the plating apparatus 200. This configuration leads to reduction of the footprint of the plating apparatus.

As described above, the cleaning apparatus 50 according to the present embodiment is applicable to the plating apparatus 200 illustrated in FIG. 3 in which the loading/unloading unit 210 and the unloading/unloading unit 230 are disposed separately from each other.

The embodiments of the present invention described above are intended to facilitate understanding of the present invention, but not to limit the present invention. The present invention can be changed and modified without departing from the scope of the invention. It should be understood that the present invention includes any equivalent thereof. In addition, any components disclosed in the claims and the specification may be optionally combined or omitted as long as at least part of the above-described problem is solved or at least part of the effect thereof is achieved.

The following lists some aspects disclosed in the present specification.

A cleaning apparatus is provided as a first aspect. This cleaning apparatus includes an inlet for a target object, an outlet for the target object, a first conveyance path on which the target object input through the inlet is conveyed, a second conveyance path on which the target object is conveyed in a direction opposite to a direction of conveyance of the target object on the first conveyance path and that is connected with the first conveyance path and the outlet, a cleaning unit disposed on the first conveyance path and configured to clean the target object in a non-contacting manner, a drying unit disposed on the first conveyance path and configured to dry the target object in a non-contacting manner, and a blowing unit disposed on the second conveyance path and configured to send gas downward from above.

According to the first aspect, the target object is cleaned in a non-contacting manner and dried in a non-contacting manner, which leads to reduced influence on resist patterns, wires, and the like on the surface of the target object. The "non-contacting manner" refers to a scheme in which no solid object such as a sponge roll contacts the target object. Since the target object is conveyed in opposite directions on the first conveyance path and the second conveyance path, a round-trip path is formed by the first conveyance path and the second conveyance path, which provides a sufficient path length while achieving reduction in the entire length of the cleaning apparatus. The round-trip path formed by the first conveyance path and the second conveyance path allows close arrangement of the inlet and the outlet. With this configuration, the target object can be input to the inlet and taken out of the outlet without involving large movement of a single target-object conveying device.

According to the first aspect, the target object is cleaned and dried on the first conveyance path connected with the inlet, and thereafter conveyed to the outlet through the second conveyance path. For example, when the target object is cleaned and dried on the second conveyance path connected with the outlet, not on the first conveyance path connected with the inlet, the target object is cleaned and dried on the second conveyance path after having passed through the first conveyance path. Thus, time is needed before the target object is cleaned and dried on the second conveyance path. In this case, processing liquid such as plating solution adhering to the surface of the target object is naturally dried before the target object is cleaned and dried, so that particles on the surface of the target object become hard to remove. According to the present aspect, however, the target object input through the inlet can be immediately cleaned and dried on the first conveyance path before the processing liquid on the surface of the target object is naturally dried. This can prevent the adhesion of particles to the surface of the target object, which would otherwise cause difficulties in removal.

According to a second aspect, in the cleaning apparatus in the first aspect, the first conveyance path and the second conveyance path are vertically arranged side by side.

According to the second aspect, the footprint of the cleaning apparatus required for the first conveyance path and the second conveyance path can be reduced.

According to a third aspect, in the cleaning apparatus in the second aspect, the first conveyance path is positioned below the second conveyance path.

According to the third aspect, the target object can be conveyed through the second conveyance path containing atmosphere cleaner than that in the first conveyance path, while particles generated by cleaning are accumulated in the first conveyance path positioned lower. This configuration can further achieve reduction of contact of the cleaned and dried target object with particles in air.

According to a fourth aspect, in the cleaning apparatus in any one of the first to third aspects, the second conveyance path functions as a stocker configured to temporarily store the target object.

According to the fourth aspect, the target object can be temporarily stored on the second conveyance path containing atmosphere cleaner than that in the first conveyance path. Accordingly, for example, when the target object input to the cleaning apparatus is plated in advance, the plating of the target object can be performed with priority on the throughput thereof and then the target object can be taken out of the cleaning apparatus at an optional appropriate timing.

According to a fifth aspect, the cleaning apparatus in any one of the first to fourth aspects includes a vertical conveyance path connecting the first conveyance path and the second conveyance path, and a vertical conveyance mechanism configured to convey the target object in a the vertical direction through the vertical conveyance path from the first conveyance path to the second conveyance path.

According to the fifth aspect, when the first conveyance path and the second conveyance path are vertically arranged side by side, the target object can be conveyed from the first conveyance path to the second conveyance path by the vertical conveyance mechanism.

According to a sixth aspect, the cleaning apparatus in any one of the first to fifth aspects further includes an inlet shutter configured to open and close the inlet, and an outlet shutter configured to open and close the outlet.

When the cleaning apparatus is mounted on, for example, a plating apparatus or a CMP apparatus, the atmosphere of the cleaning apparatus has lower cleanness than that of the plating apparatus or the CMP apparatus because of particles generated by cleaning and floating inside the cleaning apparatus. When negative pressure is maintained inside the cleaning apparatus, reduction can be achieved in flow of particles from the inside of the cleaning apparatus to the outside thereof. However, negative pressure cannot be maintained inside the cleaning apparatus, for example, when a pressure adjusting device is failed. According to the sixth aspect, since the inside and outside of the cleaning apparatus can be separated by the inlet shutter and the outlet shutter, further reduction can be achieved in the external flow of particles from the inside of the cleaning apparatus.

According to a seventh aspect, the cleaning apparatus in any one of the first to sixth aspects includes a first cleaning unit configured to spray cleaning liquid onto the target object, and a second cleaning unit configured to spray cleaning liquid and gas simultaneously onto the target object.

According to the seventh aspect, for example, plating solution adhering to the surface of the target object can be washed away by the first cleaning unit, and particles adhering to the surface of the target object can be removed by the second cleaning unit.

A plating apparatus including the cleaning apparatus in any one of the first to seventh aspects is provided as an eighth aspect. This plating apparatus includes a processing unit and a substrate conveying unit. The substrate conveying unit is configured to input the target that has been subjected to plating processing by the processing unit to the inlet of the cleaning apparatus, and take the target object processed by the cleaning apparatus out of the outlet.

A method is provided as a ninth aspect. The method for cleaning a target object in a cleaning apparatus is provided, the cleaning apparatus including an inlet for the target object, an outlet for the target object, a first conveyance path on which the target object input through the inlet is conveyed, and a second conveyance path on which the target object is conveyed in a direction opposite to a direction of conveyance of the target object on the first conveyance path and that is connected with the first conveyance path and the outlet. This cleaning method includes a process of inputting the target object into the cleaning apparatus through the inlet, a process of conveying the target object along the first conveyance path, a cleaning process of cleaning the target object in a non-contacting manner on the first conveyance path, a drying process of drying the target object in a non-contacting manner on the first conveyance path, a process of conveying the target object along the second conveyance path, and a blowing process of sending gas downward from above on the second conveyance path, and a process of taking the target object out of the outlet.

According to the ninth aspect, the target object is cleaned in a non-contacting manner and dried in a non-contacting manner, which leads to reduced influence on resist patterns, wires, and the like on the surface of the target object. The "non-contacting manner" refers to a scheme in which no solid object such as a sponge roll contacts the target object. Since the target object is conveyed in opposite directions on the first conveyance path and the second conveyance path, a round-trip path is formed by the first conveyance path and the second conveyance path, which provides a sufficient path length while achieving reduction in the entire length of the cleaning apparatus. The round-trip path formed by the first conveyance path and the second conveyance path allows close arrangement of the inlet and the outlet. With this configuration, the target object can be input to the inlet and taken out of the outlet without involving large movement of a single target-object conveying device.

According to the ninth aspect, the target object is cleaned and dried on the first conveyance path connected with the inlet, and thereafter conveyed to the outlet through the second conveyance path. For example, when the target object is cleaned and dried on the second conveyance path connected with the outlet, not on the first conveyance path connected with the inlet, the target object is cleaned and dried on the second conveyance path after having passed through the first conveyance path. Thus, time is needed before the target object is cleaned and dried on the second conveyance path. In this case, processing liquid such as plating solution adhering to the surface of the target object is naturally dried before the target object is cleaned and dried, so that particles on the surface of the target object become hard to remove. According to the present aspect, however, the target object input through the inlet can be immediately cleaned and dried on the first conveyance path before the processing liquid on the surface of the target object is naturally dried. This can prevent the adhesion of particles to the surface of the target object, which would otherwise cause difficulties in removal.

According to a tenth aspect, in the cleaning method in the ninth aspect, the first conveyance path and the second conveyance path are vertically arranged side by side.

According to the tenth aspect, the footprint of the cleaning apparatus required for the first conveyance path and the second conveyance path can be reduced.

According to an eleventh aspect, in the cleaning method in the tenth aspect, the first conveyance path is positioned below the second conveyance path.

According to the eleventh aspect, the target object can be conveyed through the second conveyance path containing atmosphere cleaner than that in the first conveyance path, while particles generated by cleaning are accumulated in the first conveyance path positioned lower. This configuration can further achieve reduction of contact of the cleaned and dried target object with particles in air.

According to a twelfth aspect, the cleaning method in any one of the ninth to eleventh aspects further includes a process of temporarily storing the target object on the second conveyance path.

According to the twelfth aspect, the target object can be temporarily stored on the second conveyance path containing atmosphere cleaner than that in the first conveyance path. Accordingly, for example, when the target object input to the cleaning apparatus is plated in advance, the plating of the target object can be performed with priority on the throughput thereof and then the target object can be taken out of the cleaning apparatus at an optional appropriate timing.

According to a thirteenth aspect, the cleaning method in any one of the ninth to twelfth aspects further includes a process of conveying the target object in the vertical direction from the first conveyance path to the second conveyance path.

According to the thirteenth aspect, when the first conveyance path and the second conveyance path are vertically arranged side by side, the target object can be conveyed from the first conveyance path to the second conveyance path.

According to a fourteenth aspect, in the cleaning method in any one of the ninth to thirteenth aspects, the cleaning process includes a first cleaning process of spraying cleaning liquid onto the target object, and a second cleaning process of spraying cleaning liquid and gas simultaneously onto the target object.

According to the fourteenth aspect, plating solution and the like adhering to the surface of the target object can be washed away through the first cleaning process, and particles adhering to the surface of the target object can be removed through the second cleaning process.

REFERENCE SIGNS LIST 27, 27a, 27b Substrate conveying device
50 Cleaning apparatus
51 Inlet
51a Inlet shutter
52 First conveyance path
53 Vertical conveyance path
54 Second conveyance path
55 Outlet
55a Outlet shutter
57, 57a, 57b Cleaning unit
58 Drying unit
61 Vertical conveyance mechanism
62 Blowing unit

The invention claimed is:

1. A cleaning apparatus comprising:
   an inlet for a target object;
   an outlet for the target object;
   a first conveyance path on which the target object input through the inlet is conveyed;
   a second conveyance path on which the target object is conveyed in a direction opposite to a direction of conveyance of the target object on the first conveyance path and that is connected with the first conveyance path and the outlet;
   a cleaning unit disposed on the first conveyance path and configured to clean the target object in a non-contacting manner; and
   a drying unit disposed on the first conveyance path and configured to dry the target object in a non-contacting manner, wherein:
   the second conveyance path is positioned above the first conveyance path and connected with the outlet at an end point, and
   the second conveyance path functions as a stocker configured to temporarily store the target object.

2. The cleaning apparatus according to claim 1, further comprising a blowing unit disposed on the second conveyance path and configured to send gas downward from above.

3. The cleaning apparatus according to claim 1, further comprising:
   a vertical conveyance path connecting the first conveyance path and the second conveyance path; and
   a vertical conveyance mechanism configured to convey the target object in a vertical direction through the vertical conveyance path from the first conveyance path to the second conveyance path.

4. The cleaning apparatus according to claim 1, further comprising:
   an inlet shutter configured to open and close the inlet; and
   an outlet shutter configured to open and close the outlet.

5. The cleaning apparatus according to claim 1, wherein the cleaning unit includes:
   a first cleaning unit configured to spray cleaning liquid onto the target object; and
   a second cleaning unit configured to spray cleaning liquid and gas simultaneously onto the target object.

6. A cleaning apparatus comprising:
   an inlet for a target object;
   an outlet for the target object;
   a first conveyance path on which the target object input through the inlet is conveyed;
   a second conveyance path on which the target object is conveyed in a direction opposite to a direction of conveyance of the target object on the first conveyance path and that is connected with the first conveyance path and the outlet;
   a cleaning unit disposed on the first conveyance path and configured to clean the target object in a non-contacting manner; and
   a drying unit disposed on the first conveyance path and configured to dry the target object in a non-contacting manner,
   the cleaning apparatus further comprising:
   an outlet shutter configured to open and close the outlet; and a blowing unit disposed at an end point of the second conveyance path and configured to send gas downward from above, wherein the second conveyance path functions as a stocker configured to temporarily store the target object.

7. The cleaning apparatus according to claim 6, further comprising:
a vertical conveyance path connecting the first conveyance path and the second conveyance path; and
a vertical conveyance mechanism configured to convey the target object in a vertical direction through the vertical conveyance path from the first conveyance path to the second conveyance path.

8. The cleaning apparatus according to claim 6, further comprising an inlet shutter configured to open and close the inlet.

9. The cleaning apparatus according to claim 6, wherein the cleaning unit includes:
a first cleaning unit configured to spray cleaning liquid onto the target object; and
a second cleaning unit configured to spray cleaning liquid and gas simultaneously onto the target object.

10. A plating apparatus comprising the cleaning apparatus according to claim 1, further comprising:
a processing unit; and
a substrate conveying unit,
wherein the substrate conveying unit is configured to input the target object that has been subjected to plating processing by the processing unit to the inlet of the cleaning apparatus and take the target object processed by the cleaning apparatus out of the outlet.

11. A cleaning apparatus comprising:
an inlet for a target object;
an outlet for the target object;
a first conveyance path on which the target object input through the inlet is conveyed;
a second conveyance path on which the target object is conveyed in a direction opposite to a direction of conveyance of the target object on the first conveyance path and that is connected with the first conveyance path and the outlet;
a cleaning unit disposed on the first conveyance path and configured to clean the target object in a non-contacting manner; and
a drying unit disposed on the first conveyance path and configured to dry the target object in a non-contacting manner, wherein:
the second conveyance path is positioned above the first conveyance path and connected with the outlet at an end point,
the cleaning apparatus further comprising:
an outlet shutter configured to open and close the outlet; and
a blowing unit disposed at the end point of the second conveyance path and configured to send gas downward from above.

12. The cleaning apparatus according to claim 11, wherein the second conveyance path functions as a stocker configured to temporarily store the target object.

13. The cleaning apparatus according to claim 11 further comprising:
a vertical conveyance path connecting the first conveyance path and the second conveyance path; and
a vertical conveyance mechanism configured to convey the target object in a vertical direction through the vertical conveyance path from the first conveyance path to the second conveyance path.

14. The cleaning apparatus according to claim 11, further comprising an inlet shutter configured to open and close the inlet.

15. The cleaning apparatus according to claim 11, wherein the cleaning unit includes:
a first cleaning unit configured to spray cleaning liquid onto the target object; and
a second cleaning unit configured to spray cleaning liquid and gas simultaneously onto the target object.

16. A plating apparatus comprising the cleaning apparatus according to claim 11, further comprising:
a processing unit; and
a substrate conveying unit,
wherein the substrate conveying unit is configured to input the target object that has been subjected to plating processing by the processing unit to the inlet of the cleaning apparatus and take the target object processed by the cleaning apparatus out of the outlet.

17. A method of cleaning a target object in a cleaning apparatus, the cleaning apparatus including an inlet for the target object, an outlet for the target object, a first conveyance path on which the target object input through the inlet is conveyed, a second conveyance path on which the target object is conveyed in a direction opposite to a direction of conveyance of the target object on the first conveyance path and that is connected with the first conveyance path and the outlet, a cleaning unit disposed on the first conveyance path and configured to clean the target object in a non-contacting manner, a drying unit disposed on the first conveyance path and configured to dry the target object in a non-contacting manner, an outlet shutter configured to open and close the outlet, and a blowing unit disposed at the end point of the second conveyance path and configured to send gas downward from above, the method comprising:
a process of inputting the target object into the cleaning apparatus through the inlet;
a process of conveying the target object along the first conveyance path;
a cleaning process of cleaning the target object in a non-contacting manner on the first conveyance path;
a drying process of drying the target object in a non-contacting manner on the first conveyance path;
a process of conveying the target object along the second conveyance path; and
a process of taking the target object out of the outlet, wherein
the first conveyance path is positioned below the second conveyance path and connected with the outlet at an end point,
the cleaning method further comprising a blowing process of sending gas downward from above at the end point of the second conveyance path.

18. The cleaning method according to claim 17, further comprising a process of temporarily storing the target object on the second conveyance path.

19. The cleaning method according to claim 17, further comprising a process of conveying the target object in a vertical direction from the first conveyance path to the second conveyance path.

20. The cleaning method according to claim 17, wherein the cleaning process includes:
  a first cleaning process of spraying cleaning liquid onto the target object, and
  a second cleaning process of spraying cleaning liquid and gas simultaneously onto the target object.

* * * * *